(12) United States Patent
Kim et al.

(10) Patent No.: US 10,180,997 B2
(45) Date of Patent: Jan. 15, 2019

(54) APPARATUS FOR SIMULATING WIND POWER FARM

(71) Applicant: Korea Electric Power Corporation, Seoul (KR)

(72) Inventors: Dong Wook Kim, Daejeon (KR); Jae Kyung Lee, Daejeon (KR); Nam Joon Jung, Daejeon (KR); Hyo Yul Choi, Daejeon (KR); Jun Shin Lee, Daejeon (KR); Jae Ju Song, Daejeon (KR)

(73) Assignee: KOREA ELECTRIC POWER CORPORATION, Seoul (KR)

( * ) Notice: Subject to any disclaimer, the term of this patent is extended or adjusted under 35 U.S.C. 154(b) by 738 days.

(21) Appl. No.: 14/286,508

(22) Filed: May 23, 2014

(65) Prior Publication Data
US 2015/0095004 A1 Apr. 2, 2015

(30) Foreign Application Priority Data
Sep. 27, 2013 (KR) ........................ 10-2013-0115240

(51) Int. Cl.
*G06F 17/50* (2006.01)
*F03D 17/00* (2016.01)
*F03D 7/04* (2006.01)

(52) U.S. Cl.
CPC ......... *G06F 17/5009* (2013.01); *F03D 7/048* (2013.01); *F03D 17/00* (2016.05);
(Continued)

(58) Field of Classification Search
CPC ...... G06F 17/5009; F03D 17/00; F03D 7/048; F05B 2260/83; F05B 2260/84; F05B 2270/20; Y02E 10/723; Y02E 10/725
See application file for complete search history.

(56) References Cited

U.S. PATENT DOCUMENTS

2014/0229153 A1* 8/2014 Grastein ............. G06F 17/5009
703/18

FOREIGN PATENT DOCUMENTS

EP 2765668 A1 8/2014
KR 10-2012-0121485 A 11/2012
(Continued)

OTHER PUBLICATIONS (Todd Austin et al., SimpleScalar: An Infrastructure for Computer System Modeling, Feb. 2002, IEEE, SimpleScalar, 59-67).*
(Continued)

*Primary Examiner* — Aniss Chad
*Assistant Examiner* — Justin C Mikowski
(74) *Attorney, Agent, or Firm* — McDermott Will & Emery LLP

(57) ABSTRACT

An apparatus for simulating a wind power farm includes a wind power generator simulator configured to act as a virtual wind power generator to dynamically generate an attribute value and provide the attribute value to a supervisory control and data acquisition (SCADA) system to be tested; a wind power generator simulation platform configured to generate and manage a plurality of wind power generator simulators within one system, monitor the system, monitor operation states of the plurality of wind power generator simulators, and transmit a result of monitoring the operation states; and a wind power farm controller configured to generate a wind power farm by grouping a plurality of wind power generator simulation platforms into a single cluster, and manage a simulation environment of the wind power farm.

10 Claims, 4 Drawing Sheets

(52) U.S. Cl.
CPC ....... *F05B 2260/83* (2013.01); *F05B 2260/84* (2013.01); *Y02E 10/723* (2013.01)

(56) References Cited

FOREIGN PATENT DOCUMENTS

| WO | 2011-040734 A2 | 4/2011 |
|---|---|---|
| WO | 2011-150941 A1 | 12/2011 |

OTHER PUBLICATIONS

Adrian Timbus, Active Management of Distributed Energy Resources Using Standardized Communications and Modern Information Technologies, IEEE Transactions on Industrial Electronics, vol. 56, No. 10, Oct. 2009.*

Pasi Laakso, et. al., Methods of simulation-assisted automation testing, Otamedia Oy, Espoo 2005, VTT Research Notes 2289, 1-59. (Year: 2005).*

Rudion, K et al. "MaWind—Tool for the Aggregation of Wind Farm Models", Power and Energy Society General Meeting Conversion and Delivery of Electrical Energy in the 21st Century, 2008 IEEE, IEEE, Piscataway, NJ. Jul. 20, 2008, pp. 1-8.

Van der Hooft, E.L. et al. "Real Time Process Simulation for Evaluation of Wind Turbine Control Systems", Internet Citation, URL: http://www.ecn.nl/docs/library/report/2003/rx03043.pdf, Aug. 14, 2008, pp. 1-4.

Extended European Search Report dated Jan. 14, 2015, issued in corresponding European Patent Application No. 14169656.7.

Fernandez, L. M., et al., "Dynamic Models of Wind Farms with Fixed Speed Wind Turbines," Renewable Energy, Pergamon Press, Oxford, GB vol. 31, No. 8, Jul. 1, 2006, pp. 1203-1230.

Communication pursuant to Article 94(3) EPC, issued in corresponding European Patent Application No. 14 169 656.7-1607, dated Jul. 3, 2017.

* cited by examiner

APPARATUS FOR SIMULATING WIND POWER FARM

CROSS-REFERENCE TO RELATED APPLICATION

This application claims priority to and the benefit of Korean Patent Application No. 2013-0115240, filed on Sep. 27, 2013, the disclosure of which is incorporated herein by reference in its entirety.

BACKGROUND

1. Field of the Invention

The present invention relates to an apparatus for simulating a wind power farm, and more particularly, to an apparatus for simulating a wind power farm, which is capable of providing a simulation environment of a large-scale wind power farm for verifying the functionality and stability of a supervisory control and data acquisition (SCADA) system configured to monitor and control a wind power farm at low costs, regardless of location.

2. Discussion of Related Art

In general, an electric power generation system means a system capable of generating electric power using a driving source such as a turbine, an engine, a fuel cell, etc.

As new and renewable eco-friendly energy sources have been recently installed increasingly worldwide in preparation for depletion of energy and environmental pollution, there is a growing need for a wind power generator that generates wind power which is a representative example of new and renewable energy.

The wind power generator generates electric power by transforming the energy of wind into mechanical energy (rotary power) by using a blade. The mechanical energy is transformed into electric energy to generate electric power by driving an electric power generator. Wind power is an energy source having the highest economic feasibility among new and renewable energy sources that have been developed. Furthermore, wind power is a clean, limitless, and less costly energy source.

Wind power generators may be classified into horizontal wind power generators and vertical wind power generators according to the direction of a rotary shaft with respect to the ground. In general, a wind power generator includes a rotor including a blade and a hub, a gearbox that increases the speed of rotation to drive a generator, a generator that generates electric power, a cooling and heating system that appropriately controls operating temperatures of the elements of the wind power generator, a controller that controls various stabilization devices, a brake device, an electric power control system, a steel tower, etc.

As demands for the stability and reliability of wind power generators has increased, there is a growing need for a monitoring system configured to obtain status data from sensors (e.g., a weathercock/wind gauge of a wind power generator, an ammeter that measures the statuses of main components, or a thermometer) and controllers (e.g., a pitch controller of a blade, a yaw controller, and a power control system), and to monitor and control the states of the main components of the wind power generator so that the wind power generator may stably generate electric power.

In particular, it is not possible to approach the vicinity of a wind power generator that is being driven due to safety problems. Thus, there is a growing need for a status monitor and control system capable of obtaining status data of main components, and monitoring and controlling the statuses of the main components.

The background art of the present invention is disclosed in Korean Laid-Open Patent Publication No. 2012-0121485, published on Nov. 6, 2012 and entitled "Simulation Device for a Wind Power Generator, Capable of Preventing a Bearing or a Shaft from Becoming Worn Out or Broken in Advance".

SUMMARY OF THE INVENTION

In general, a large-scale wind power farm is located in a high mountainous region, a coastal region, or the like to easily generate wind power energy in terms of geographical conditions, and at a point at which the large-scale wind power farm is grid-linked to a system is the end of a track. Thus, the reliabilities of voltage control and electric power quality are lowered when a large-scale wind power farm is linked to a system. That is, the features of a wind power generator linked to a real grid need to be understood by conducting a preliminary effects evaluation and a verification test.

Thus, a supervisory control and data acquisition (SCADA) system has been installed in a wind power farm to efficiently and stably mange the wind power farm.

The SCADA system configured to operate a wind power farm is a computer-based system that remotely controls a wind power turbine in association with a controller of the wind power turbine and collects data for analyzing and reporting the operating performance of the wind power turbine. The functions of the SCADA system are largely divided into a control function, a monitoring function, an analysis function, and a reporting function.

Since a real grid is greatly influenced by a large-scale wind power farm, the importance of a SCADA system of the large-scale wind power farm, which is capable of efficiently operating the large-scale wind power farm and rapidly handling a real grid, has greatly increased.

That is, when the SCADA system, configured to monitor and control a wind power farm, malfunctions, the operation of the whole wind power farm may be stopped and an expensive wind power generator may break down. Thus, not only the importance of the SCDA system of the wind power farm but also a failure risk of the SCDA system increases.

Also, since a large-scale wind power farm includes wind power generators manufactured by various manufacturers, non-standard factors are likely to be present between the wind power generators and the SCADA system. Thus, the SCADA system should operate the whole wind power farm while dealing with the non-standard factors of the wind power generators and thus, the size and complexity of the SCADA system increases. Accordingly, the stability of the SCADA system is highly likely to be lowered.

In general, a method of developing a SCADA system for operating a small-scale wind power farm is applied to development of a SCADA system for operating a large-scale wind power farm. Thus, it is difficult to secure the functionality and stability of the SCADA system for operating a large-scale wind power farm.

Thus, there is a growing need to verify a SCADA system in a simulation environment similar to the environment of a real wind power farm.

The present invention is directed to an apparatus for simulating a wind power farm, which is capable of providing a simulation environment of a large-scale wind power farm for verifying the functionality and stability of a SCADA system configured to monitor and control a wind power farm at low costs, regardless of location.

The present invention is also directed to an apparatus for simulating a wind power farm, which is capable of providing a simulation environment of a large-scale wind power farm by virtually simulating wind power generators for the wind power farm when the size of the wind power farm is defined.

The present invention is also directed to an apparatus for simulating a wind power farm, which is capable of flexibly providing a simulation environment of a large-scale wind power farm by establishing an operating environment based on a plurality of systems and managing the plurality of systems in an integrated manner by grouping the plurality of systems into a single cluster.

According to an aspect of the present invention, an apparatus for simulating a wind power farm includes a wind power generator simulator configured to act as a virtual wind power generator to dynamically generate an attribute value and provide the attribute value to a supervisory control and data acquisition (SCADA) system to be tested; a wind power generator simulation platform configured to generate and manage a plurality of wind power generator simulators within one system, monitor the system, monitor operation states of the plurality of wind power generator simulators, and transmit a result of monitoring the operation states; and a wind power farm controller configured to generate a wind power farm by grouping a plurality of wind power generator simulation platforms into a single cluster, and manage a simulation environment of the wind power farm.

The wind power farm controller may include a simulation platform management unit configured to monitor and manage the plurality of wind power generator simulation platforms; a remote generator controller configured to remotely control the wind power generator simulator that constitutes the wind power farm; a simulation platform resource monitor unit configured to monitor resources of the system in which the wind power generator simulation platform is established; a wind power farm management unit configured to manage the simulation environment of the wind power farm and provide information regarding an operation state of the wind power farm; and a client message connector configured to exchange a job message with the wind power generator simulation platform and parse the job message.

The wind power generator simulation platform may include a server message connector configured to exchange a message with the wind power farm controller; a generator management unit configured to generate or remove the wind power generator simulator and manage an operation of the wind power generator simulator; a resource monitor unit configured to trace a rate of utilizing hardware resources in the system according to an operation of the wind power generator simulator; a platform management unit configured to provide the wind power farm controller with a function of controlling and managing the system in which the wind power generator simulation platform is established; a data management unit configured to manage common environmental information of the wind power simulator generated by the wind power generator simulation platform; and a generator pool configured to register and manage the wind power generator simulator, which is generated by the generator management unit, in the form of a hash table.

The common environmental information may include simulation set files in units of logical nodes (LNs) for generating virtual data, weather information, and time synchronization information.

The wind power generator simulator may include a generator environment configuration unit configured to set environmental information and operation information for operating the wind power generator simulator; a data generator configured to generate an LN attribute value according to characteristics values of a virtual wind power generator defined by a user, based on a configuration set by the generator environment configuration unit; an attribute value storing unit configured to store the LN attribute value generated by the data generator; and a communication management unit configured to transmit the LN attribute value stored in the attribute value storing unit to the SCADA system to be tested.

The communication management unit may transmit the LN attribute value using one of an object linking and embedding (OLE) for process control (OPC) protocol, a modbus protocol, or a manufacturing message specification (MMS) protocol.

The data generator may generate the LN attribute value according to one of a random method, a sequence method and an algorithm method.

The characteristic values of the virtual wind power generator may include at least one among a wind velocity, a pitch angle, an air density, a mechanical angular velocity of a rotor, and the radius of the rotor, a low blocking speed lower than a first reference speed, a high blocking speed higher than a second reference speed, a rated torque, and an output torque.

The attribute value storing unit may store the LN attribute value using LN factors including an index, a node name, and a data pointer.

BRIEF DESCRIPTION OF THE DRAWINGS

The above and other objects, features, and advantages of the present invention will become more apparent to those of ordinary skill in the art by describing in detail exemplary embodiments thereof with reference to the accompanying drawings, in which.

DETAILED DESCRIPTION OF EXEMPLARY EMBODIMENTS

Figure 1:
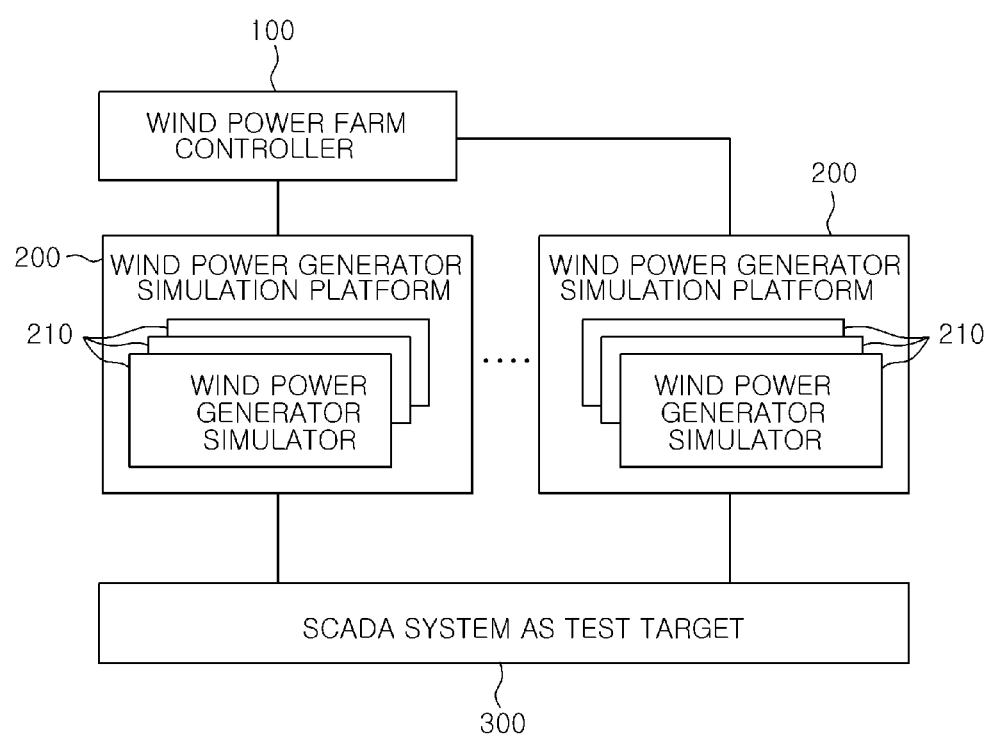
FIG. 1 is a block diagram of an apparatus for simulating a wind power farm according to an exemplary embodiment of the present invention.

Hereinafter, an apparatus for simulating a wind power farm according to an exemplary embodiment of the present invention will be described in detail below with reference to the accompanying drawings. In the drawings, the thicknesses of lines and the sizes of elements may be exaggerated for clarity and convenience of explanation.

The specific terms used in the present disclosure are defined in consideration of functions according to the present invention and may thus vary according to the intention of a user or an operator or according to practices. Thus, these terms should be defined according to the whole context of the present disclosure.

FIG. 1 is a block diagram of an apparatus for simulating a wind power farm according to an exemplary embodiment of the present invention.

Referring to FIG. 1, the apparatus for simulating a wind power farm according to an embodiment of the present invention includes a wind power generator simulator 210, a wind power generator simulation platform 200, and a wind power farm controller 100.

The wind power generator simulator 210 functions as a virtual wind power generator to dynamically generate an attribute value and provide the attribute value to a supervisory control and data acquisition (SCADA) system 300 to be tested.

That is, the wind power generator simulator 210 dynamically generates a standard IEC61400-25 logical node (LN) attribute value and transmits this value to the SCADA system 300 outside the wind power generator simulator 210 using an object linking and embedding (OLE) for process control (OPC) protocol, a modbus protocol, or a manufacturing message specification (MMS) protocol defined in the IEC61400-25 standard.

The wind power generator simulation platform 200 generates and manages a plurality of wind power generator simulators 210 within one system, monitors hardware resources (a central processing unit (CPU), a memory, a network, a hard disk, etc.) installed in the system, monitors an operation state of the wind power generator simulator 210, and transmits a result of monitoring the operation state of the wind power generator simulator 210 to the wind power farm controller 100 at a remote place.

The wind power farm controller 100 generates a wind power farm by grouping a plurality of wind power generator simulation platforms 200 into a single cluster, and manages a simulation environment of the generated wind power farm.

It is difficult to simulate a large-scale wind power farm including a plurality of wind power generators within a single system due to limited hardware resources of the system. An apparatus for simulating a wind power farm according to an embodiment of the present invention establishes wind power generator simulation platforms 200 in a plurality of systems in the same operation environment, and manages the wind power generator simulation platforms 200 by grouping the wind power generator simulation platforms 200 into a single cluster. Thus, each of the wind power generator simulation platforms 200 generates and manages the wind power generator simulators 210 in an integrated manner using the wind power farm controller 100 to provide a simulation environment of a wind power farm within a range of the resources of each of the systems.

Thus, when a tester requests to generate a new virtual wind power generator using the wind power farm controller 100 at a remote place, the wind power generator simulation platform 200 generates the wind power generator simulator 210 and transmits in real time an attribute value, which is obtained by simulating a virtual wind power generator, as test data to the SCADA system 300 to be tested.

Figure 2:
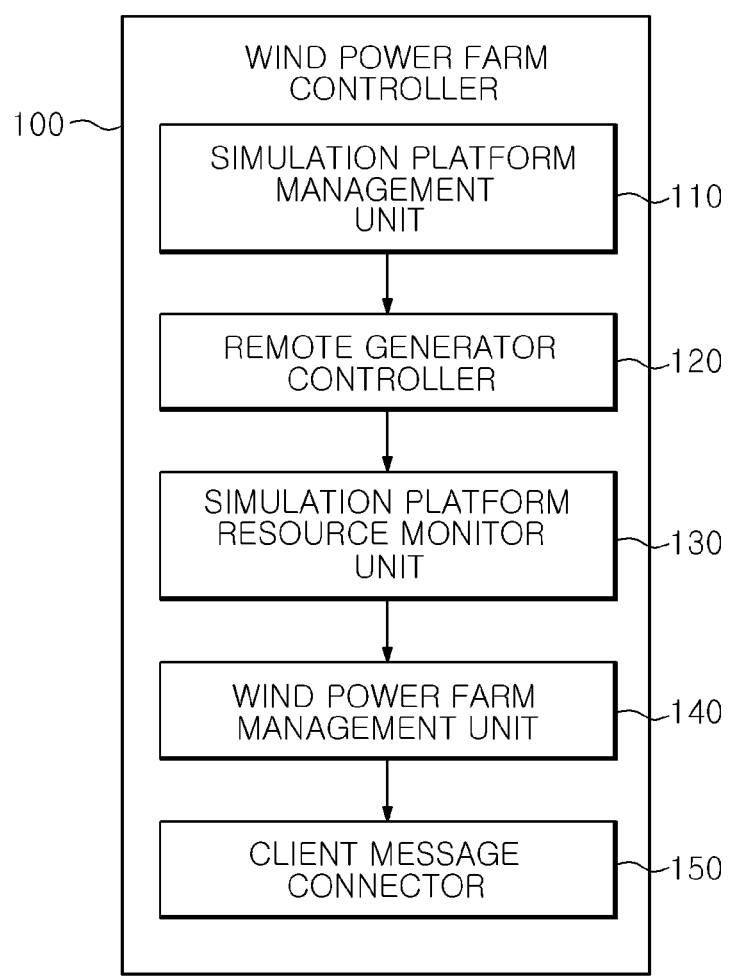
FIG. 2 is a detailed block diagram of a wind power farm controller included in an apparatus for simulating a wind power farm according to an exemplary embodiment of the present invention.

FIG. 2 is a detailed block diagram of a wind power farm controller 100 included in an apparatus for simulating a wind power farm according to an exemplary embodiment of the present invention.

Referring to FIG. 2, the structure of the wind power farm controller 100 included in the apparatus for simulating a wind power farm according to an embodiment of the present invention will now be described in detail below.

The wind power farm controller 100 includes a simulation platform management unit 110, a remote generator controller 120, a simulation platform resource monitor unit 130, a wind power farm management unit 140, and a client message connector 150.

The simulation platform management unit 110 monitors and manages the plurality of wind power generator simulation platforms 200.

That is, the simulation platform management unit 110 provides a function of registering/deleting a new wind power generator simulation platform 200, and functions related to multiple Internet protocols (IPs) assigned to respective systems, time synchronization, and virtual data setting.

The remote generator controller 120 remotely controls wind power generator simulators 210 that constitute a wind power farm.

That is, the remote generator controller 120 performs a control function of generating/removing wind power generator simulators 210 that are virtual wind power generators that constitute a virtual wind power farm, and a function of setting the features of a generated virtual wind power generator in the wind power generator simulators 210.

The remote generator controller 120 provides a function of detecting the wind power generator simulation platforms 200 registered with the wind power farm controller 100, selecting a wind power generator simulation platform 200 for generating a virtual wind power generator from a list of the detected wind power generator simulation platforms 200, requesting the selected wind power generator simulation platform 200 to generate a virtual wind power generator, receiving a result of generating a virtual wind power generator from the selected wind power generator simulation platform 200, and setting a function of the wind power generator simulator 210.

The simulation platform resource monitor unit 130 monitors a rate of utilizing hardware resources of a system established by the wind power generator simulation platform 200.

By monitoring the rate of utilizing resources in real time as described above, it is possible to prevent overload from being intensively applied to a specific system in which the wind power generator simulation platform 200 is established, and an alarm setting function may be provided based on the monitored (collected) rate of utilizing resources.

The wind power farm management unit 140 manages a simulation environment of a wind power farm and provides information regarding an operation state of the wind power farm. The wind power farm management unit 140 provides information regarding an operation state of a virtual wind power farm to a tester while managing general information regarding a virtual wind power farm (e.g., a generation and operation history and information regarding the tester) and information regarding an external system (e.g., a time server, a weather center, a data storage).

The client message connector 150 exchanges a job message with the plurality of wind power generator simulation platforms 200, and parses the job message.

Figure 3:
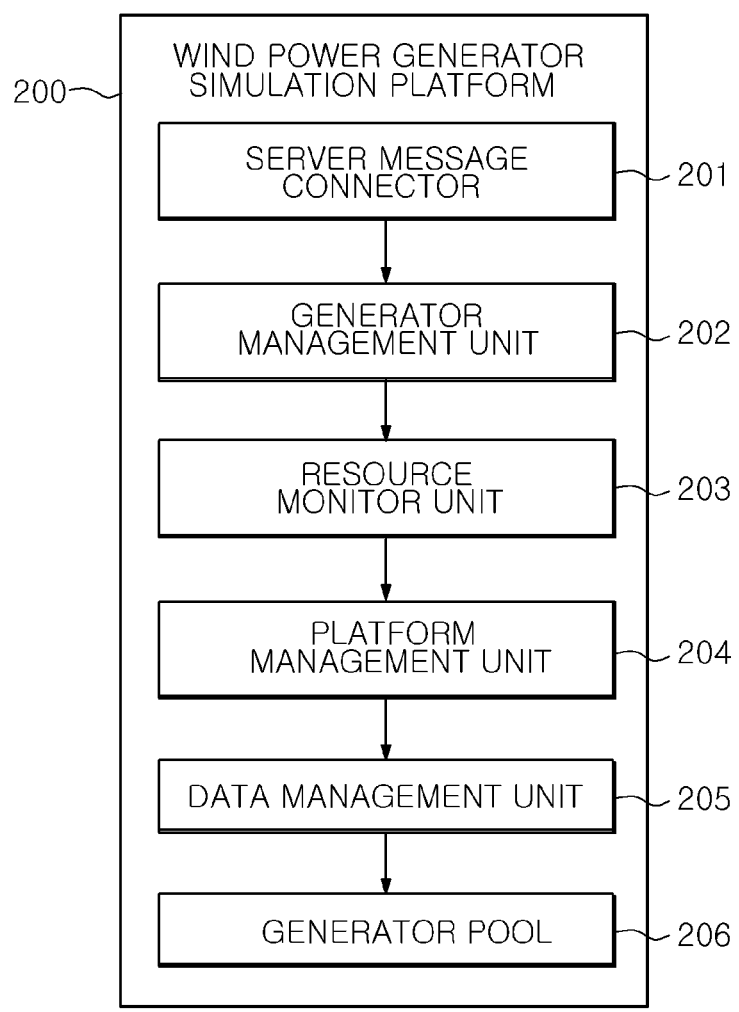
FIG. 3 is a detailed block diagram of a wind power generator simulation platform included in an apparatus for simulating a wind power farm according to an exemplary embodiment of the present invention.

FIG. 3 is a detailed block diagram of the wind power generator simulation platform 200 included in an apparatus for simulating a wind power farm according to an exemplary embodiment of the present invention.

Referring to FIG. 3, the structure of the wind power generator simulation platform 200 included in an apparatus for simulating a wind power farm according to an embodiment of the present invention will be described in detail below.

The wind power generator simulation platform 200 according to an embodiment of the present invention includes a server message connector 201, a generator management unit 202, a resource monitor unit 203, a platform management unit 204, a data management unit 205, and a generator pool 206.

The server message connector 201 is connected to the client message connector 150 of the wind power farm controller 100 to exchange a message with the client message connector 150.

The generator management unit 202 generates or removes the wind power generator simulator 210 and manages (e.g., starts/stops) an operation of the wind power generator simulator 210.

When the wind power farm controller 100 requests to generate a virtual wind power generator, a wind power generator simulator 210 acting as a virtual wind power generator is generated and inserted into a hash table that constitutes the generator pool 206 to be registered with the generator pool 206. Then, environmental features of the wind power generator simulator 210 are defined.

The resource monitor unit 203 traces the rate of utilizing hardware resources in a system when the wind power generator simulator 210 operates.

Since a virtual wind power generator is simulated by generating a plurality of wind power generator simulators 210 in one system in which a wind power generator simulation platform 200 is established, the number of wind power generator simulators 210 to be generated by one wind power generator simulation platform 200 depends on hardware resources (e.g., the capacities of a CPU, a memory, and a hard disk) of an established system. Thus, the wind power generator simulation platform 200 should constantly monitor the resources of a corresponding system.

The platform management unit 204 provides the wind power farm controller 100 with a function of controlling and managing the system in which the wind power generator simulation platform 200 is established.

That is, the platform management unit 204 enables the wind power farm controller 100 to reboot the system, change an IP, start/stop the generator simulation platform 200, set a weather center, etc.

The data management unit 205 manages common environmental information of the wind power generator simulator 210 generated by the wind power generator simulation platform 200.

Examples of the common environmental information include simulation set files in units of logical nodes (LNs) for generating virtual data, weather information, and time synchronization information.

The generator pool 206 registers and manages wind power generator simulators 210, which are generated by the generator management unit 202, in the form of a hash table so that a desired process can be directly accessed when a specific wind power generator simulator 210 is accessed.

Figure 4:
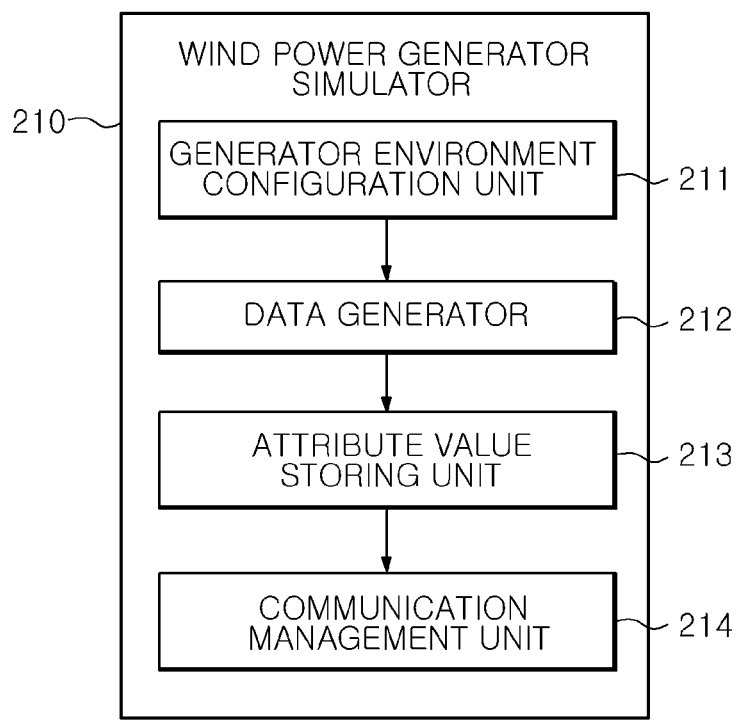
FIG. 4 is a detailed block diagram of a wind power generator simulator included in an apparatus for simulating a wind power farm according to an exemplary embodiment of the present invention.

FIG. 4 is a detailed block diagram of a wind power generator simulator 210 included in an apparatus for simulating a wind power farm according to an exemplary embodiment of the present invention.

Referring to FIG. 4, the structure of the wind power generator simulator 210 included in the apparatus for simulating a wind power farm according to an exemplary embodiment of the present invention will now be described in detail.

The wind power generator simulator 210 according to an embodiment of the present invention includes a generator environment configuration unit 211, a data generator 212, an attribute value storing unit 213, and a communication management unit 214.

The generator environment configuration unit 211 sets environmental and operational information for operating the wind power generator simulator 210.

That is, the generator environment configuration unit 211 sets a simulation set value for generating an LN attribute value, network environment information for communicating with the SCADA system 300 as a test target, and information for operating a virtual wind power generator by the wind power generator simulator 210 (a performance time, a rate of disability, the number of times of generating data per second).

The data generator 212 generates an LN attribute value indicating the state of a virtual wind power generator according to the characteristic values of the virtual wind power generator defined by a user, based on a configuration set by the generator environment configuration unit 211.

In this case, the characteristic values of the virtual wind power generator include a wind velocity, a pitch angle, an air density, a mechanical angular velocity of a rotor which are external inputs, and the radius of the rotor, a low blocking speed lower than a first reference speed, a high blocking speed higher than a second reference speed, a rated torque, and an output torque which are parameter inputs.

The data generator 212 generates the LN attribute value using one of a random method, a sequence method, or an algorithm method, according to a purpose of a virtual wind power generator.

Specifically, the random method is used to conduct an overall communication test between the SCADA system 300 as a test target and virtual wind power generators. The sequence method is used to conduct an exact data transfer test between the SCADA system 300 as a test target and virtual wind power generators. The algorithm method is used to conduct a simulation test on a wind power farm.

The algorithm method has a function of generating an LN attribute value indicating an abnormal state of a wind power generator. Thus, when a simulation test of a virtual wind power farm indicates an abnormal state of a specific wind power generator to a user, the abnormal state may be used to determine whether the abnormal state may be sensed by the SCADA system 300 as a test target.

The attribute value storing unit 213 stores an LN attribute value generated by the data generator 212 according to standards defined in the IEC61400-25 standard which is a wind power generation communication standard.

The attribute value storing unit 213 stores the LN attribute value based on LN factors such as an index, a node name, and a data pointer.

The communication management unit 214 transmits the LN attribute value stored in the attribute value storing unit 213 to the SCADA system 300 to be tested.

The communication management unit 214 transmits the LN attribute value to the SCADA system 300 outside the communication management unit 214 using various communication protocols, such as the OPC protocol, the Modbus protocol, or the MMS protocol defined in the IEC61400-25.

As described above, an apparatus for simulating a wind power farm according to an embodiment of the present invention is capable of providing a simulation environment of a large-scale wind power farm for verifying the functionality and stability of the SCADA system configured to monitor and control a wind power farm at low costs, regardless of location. Also, when the size of the wind power farm is defined, wind power generators corresponding to the size of the wind power farm are virtually simulated to provide a simulation environment of the wind power farm. Also, an operation environment may be established based on a plurality of systems and the plurality of systems may be managed in an integrated manner by grouping them into a single cluster, thereby flexibly providing a simulation environment of a large-scale wind power farm.

An apparatus for simulating a wind power farm according to an embodiment of the present invention may be not only used to verify the functionality and stability of a SCADA system as a test target but also used as a test bed to verify the suitability, functionality, performance, and stability of a communication protocol before a wind power farm system is installed at a site when the function of the wind power farm system is improved and when a new wind power farm system is developed. Also, the apparatus may be used to develop a predicted wind condition model for detecting predicted wind condition data and influential factors between outputs of a wind power farm and a wind power generator in a virtual wind power farm. Also, a virtual offshore wind power farm for operating a wind power farm and optimizing an output of the wind power farm may be simulated and used to train an operator.

An apparatus for simulating a wind power farm according to an embodiment of the present invention is capable of providing a simulation environment of a large-scale wind power farm to verify the functionality and stability of the SCADA system configured to monitor and control a wind power farm at low costs, regardless of location.

Also, an apparatus for simulating a wind power farm according to an embodiment of the present invention is capable of providing a simulation environment of a wind power farm by virtually simulating wind power generators corresponding to the size of a wind power farm when the size of the wind power farm is defined.

Also, an apparatus for simulating a wind power farm according to an embodiment of the present invention is capable of flexibly providing a simulation environment of a large-scale wind power farm by establishing an operation environment based on a plurality of systems and managing the plurality of systems in an integrated manner by them into a single cluster.

Although the present invention has been described based on the exemplary embodiments illustrated in the drawings, it will be apparent to those skilled in the art that various modifications can be made to the exemplary embodiments of the present invention without departing from the spirit or scope of the invention. Thus, it is intended that the present invention covers all such modifications provided they come within the scope of the appended claims and their equivalents.

What is claimed is:

1. An apparatus for simulating a wind power farm, comprising:
   a processor including:
   a wind power generator simulator configured to act as a virtual wind power generator to dynamically generate an attribute value and provide the attribute value to a supervisory control and data acquisition (SCADA) system to be tested;
   a wind power generator simulation platform configured to generate and manage a plurality of wind power generator simulators within one system, monitor hardware resources installed in the system, monitor operation states of the plurality of wind power generator simulators, and transmit a result of monitoring the operation states; and
   a wind power farm controller configured to generate a wind power farm by grouping a plurality of wind power generator simulation platforms into a single cluster, and manage a simulation environment of the wind power farm,
   the SCADA system controls a physical wind power turbine based on the simulation environment of the wind power farm,
   wherein each of the wind power generator simulation platforms generates the plurality of wind power generator simulators using the wind power farm controller to provide the simulation environment of the wind power farm within a range of the hardware resources of each of the systems, and
   wherein, when the wind power farm controller receives a request from a user to generate a new virtual wind power generator, the wind power farm controller controls the wind power generator simulation platform to generate a wind power generator simulator and to transmit in real time the attribute value, which is obtained by simulating a virtual wind power generator, as test data to the SCADA system to be tested, whereby a simulation environment of a large-scale wind power farm to verify the functionality and stability of the SCADA system is provided.

2. The apparatus of claim 1, wherein the wind power farm controller comprises:
   a simulation platform management unit configured to monitor and manage the plurality of wind power generator simulation platforms;
   a remote generator controller configured to remotely control the wind power generator simulator that constitutes the wind power farm;
   a simulation platform resource monitor unit configured to monitor the hardware resources of the system in which the wind power generator simulation platform is established;
   a wind power farm management unit configured to manage the simulation environment of the wind power farm and provide information regarding an operation state of the wind power farm; and
   a client message connector configured to exchange a job message with the wind power generator simulation platform and parse the job message.

3. The apparatus of claim 1, wherein the wind power generator simulation platform comprises:
   a server message connector configured to exchange a message with the wind power farm controller;
   a generator management unit configured to generate or remove the wind power generator simulator and manage an operation of the wind power generator simulator;
   a resource monitor unit configured to trace a rate of utilizing the hardware resources in the system according to an operation of the wind power generator simulator;
   a platform management unit configured to provide the wind power farm controller with a function of controlling and managing the system in which the wind power generator simulation platform is established;
   a data management unit configured to manage common environmental information of the wind power simulator generated by the wind power generator simulation platform; and a generator pool configured to register and manage the wind power generator simulator, which is generated by the generator management unit, in the form of a hash table.

4. The apparatus of claim 3, wherein the common environmental information comprises simulation set files in units of logical nodes (LNs) for generating virtual data, weather information, and time synchronization information.

5. The apparatus of claim 1, wherein the wind power generator simulator comprises:
a generator environment configuration unit configured to set environmental information and operation information for operating the wind power generator simulator;
a data generator configured to generate an LN attribute value according to characteristics values of a virtual wind power generator defined by a user, based on a configuration set by the generator environment configuration unit;
an attribute value storing unit configured to store the LN attribute value generated by the data generator; and
a communication management unit configured to transmit the LN attribute value stored in the attribute value storing unit to the SC AD A system to be tested.

6. The apparatus of claim 5, wherein the communication management unit transmits the LN attribute value using one of an object linking and embedding (OLE) for process control (OPC) protocol, a Modbus protocol, or a manufacturing message specification (MMS) protocol.

7. The apparatus of claim 5, wherein the data generator generates the LN attribute value according to one of a random method, a sequence method and an algorithm method.

8. The apparatus of claim 5, wherein the characteristic values of the virtual wind power generator comprise at least one among a wind velocity, a pitch angle, an air density, a mechanical angular velocity of a rotor, a radius of the rotor, a low blocking speed lower than a first reference speed, a high blocking speed higher than lower a second reference speed, a rated torque, and an output torque.

9. The apparatus of claim 5, wherein the attribute value storing unit stores the LN attribute value using LN factors including an index, a node name, and a data pointer.

10. The apparatus of claim 1, wherein the wind power farm controller monitors a rate of utilizing hardware resources of a system established by the wind power generator simulation platform in real time to prevent overload from being applied to the system in which the wind power generator simulation platform is established by setting an alarm based on the monitored rate of utilizing hardware resources.

* * * * *